United States Patent
Avanzino et al.

(10) Patent No.: US 6,403,474 B1
(45) Date of Patent: Jun. 11, 2002

(54) CONTROLLED ANNEAL CONDUCTORS FOR INTEGRATED CIRCUIT INTERCONNECTS

(75) Inventors: Steven C. Avanzino, Cupertino; Pin-Chin Connie Wang, Menlo Park; Minh Van Ngo, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/745,917

(22) Filed: Dec. 20, 2000

(51) Int. Cl.[7] ............................................... H01L 21/44
(52) U.S. Cl. ..................... 438/660; 438/663; 438/625; 438/642; 438/672
(58) Field of Search ................................ 438/660, 661, 438/663, 618, 625–629, 642–645, 652–654, 672

(56) References Cited

U.S. PATENT DOCUMENTS 5,494,860 A * 2/1996 McDevitt et al. ........... 438/625
5,932,289 A * 8/1999 Dobson et al. .............. 427/585
6,297,154 B1 * 10/2001 Gross et al. ................. 438/663

OTHER PUBLICATIONS

IBM TDB No. NN81091976, "Using Titanium Nitride and Silicon Nitride for VLSI Contacts", Sep. 1981.*

* cited by examiner

Primary Examiner—Carl Whitehead, Jr
Assistant Examiner—Jamie L. Brophy
(74) Attorney, Agent, or Firm—Mikio Ishimaru

(57) ABSTRACT

A method is provided for manufacturing an integrated circuit on a semiconductor wafer having a semiconductor substrate with a semiconductor device thereon. A dielectric layer is formed on the semiconductor substrate and an opening is formed in the dielectric layer. A barrier layer is deposited to line the opening. A seed layer is deposited on the barrier layer and securely bonds to the barrier layer. A conductor layer is deposited to fill the channel opening over the barrier layer. A planarization technique is used to planarize the barrier, seed layer, and conductor layers to be coplanar with the dielectric layer to form a conductor channel. The semiconductor wafer is then subjected to a two step timed anneal.

9 Claims, 2 Drawing Sheets

CONTROLLED ANNEAL CONDUCTORS FOR INTEGRATED CIRCUIT INTERCONNECTS

TECHNICAL FIELD

The present invention relates generally to semiconductor technology and more specifically to annealing conductors in semiconductor processing.

BACKGROUND ART

In the manufacture of integrated circuits, after the individual devices such as the transistors have been fabricated in and on the semiconductor substrate, they must be connected together to perform the desired circuit functions. This interconnection process is generally called "metalization" and is performed using a number of different photolithographic, deposition, and removal techniques.

Briefly, individual semiconductor devices are formed in and on a semiconductor substrate and a device dielectric layer is deposited. Various techniques are used to form gate and source/drain contacts, which extend up to the surface of the device dielectric layer. In a process called the "damascene" technique, dielectric layers are deposited over the device dielectric layers and openings are formed in the dielectric layers. Conductor materials are deposited on the dielectric layers and in the openings. A process is used to planarize the conductor materials with the surface of the dielectric layers so as to cause the conductor materials to be "inlaid" in the dielectric layers.

More specifically for a single layer of interconnections, a "single damascene" technique is used in which the first channel formation of the single damascene process starts with the deposition of a thin first channel stop layer over the device dielectric layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide fair barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit. However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

For more complex integrated circuits, a "dual damascene" technique is used in which channels of conductor materials are separated by interlayer dielectric layers in vertically separated planes and interconnected by vertical connections, or "vias".

More specifically, the dual damascene process starts with the deposition of a thin etch stop layer, or the via stop layer, over the first channels and the first channel dielectric layer. A via dielectric layer is deposited on the via stop layer. Again, where the via dielectric layer is of an oxide material, such as silicon oxide, the via stop layer is a nitride, such as silicon nitride, so the two layers can be selectively etched.

Second channel stop and second channel dielectric layers are formed on the via dielectric layer. Again, where the second channel dielectric layer is of an oxide material, such as silicon oxide, the second channel stop layer is a nitride, such as silicon nitride, so the two layers can be selectively etched. The second channel and via stop layers and second channel and via dielectric layers are then subject to further photolithographic process, etching, and photoresist removal steps to form via and second channel openings in the pattern of the second channels and the vias.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The capping layer may be an etch stop layer and may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metalization process. The elimination of metal etch steps is important as the semiconductor industry moves from aluminum (Al) to other metalization materials, such as copper, which are very difficult to etch.

A major problem occurs during the annealing process of conductor layers, which have been deposited by electroplating. The annealing is desirable to cause grain growth, which results in desirable reduced resistivity and stress levels. The problem is that the annealing causes the coalescence of microscopic voids in the conductor layer into macroscopic voids which reduce the current carrying capability of the finished conductor core and potentially lead to early failures of the integrated circuit.

Solutions to this problem have been long sought but have long eluded those skilled in the art.

DISCLOSURE OF THE INVENTION

The present invention further provides a method for manufacturing an integrated circuit on a semiconductor wafer having a semiconductor substrate with a semiconductor device thereon. A dielectric layer is formed on the semiconductor substrate and an opening is formed in the dielectric layer. A barrier layer is deposited to line the opening. A seed layer is deposited on the barrier layer and securely bonds to the barrier layer. A conductor layer is deposited to fill the channel opening over the barrier layer. The semiconductor wafer is then subjected to a two step timed anneal. A planarization technique is used to planarize the barrier, seed layer, and conductor layers to be coplanar with the dielectric layer to form a conductor channel.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
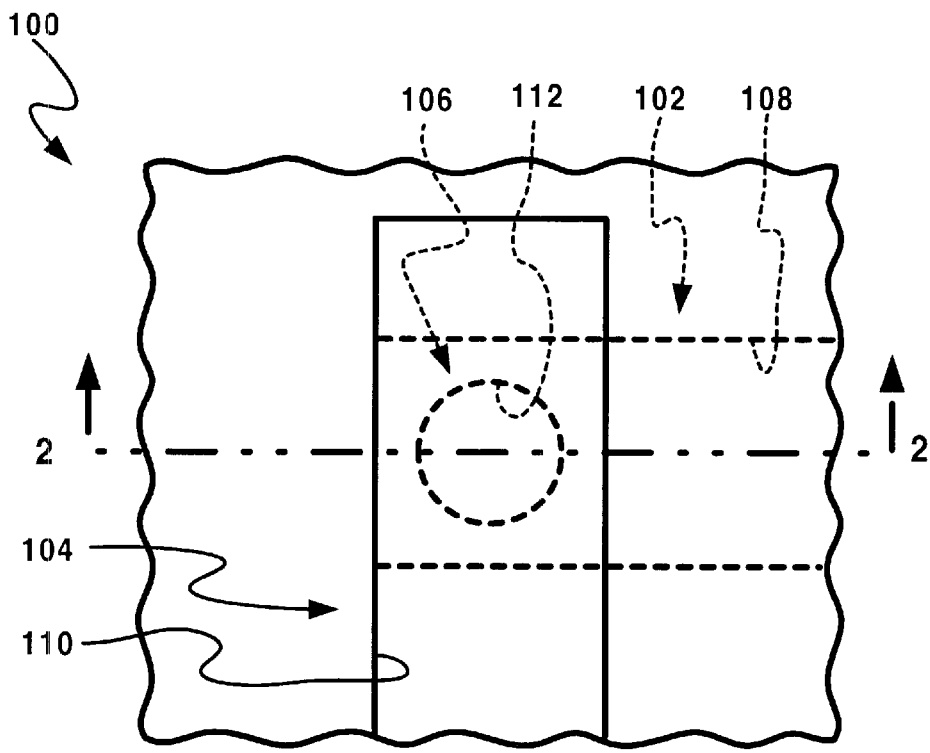
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used in herein is defined as a plane parallel to the conventional plane or surface of a semiconductor wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
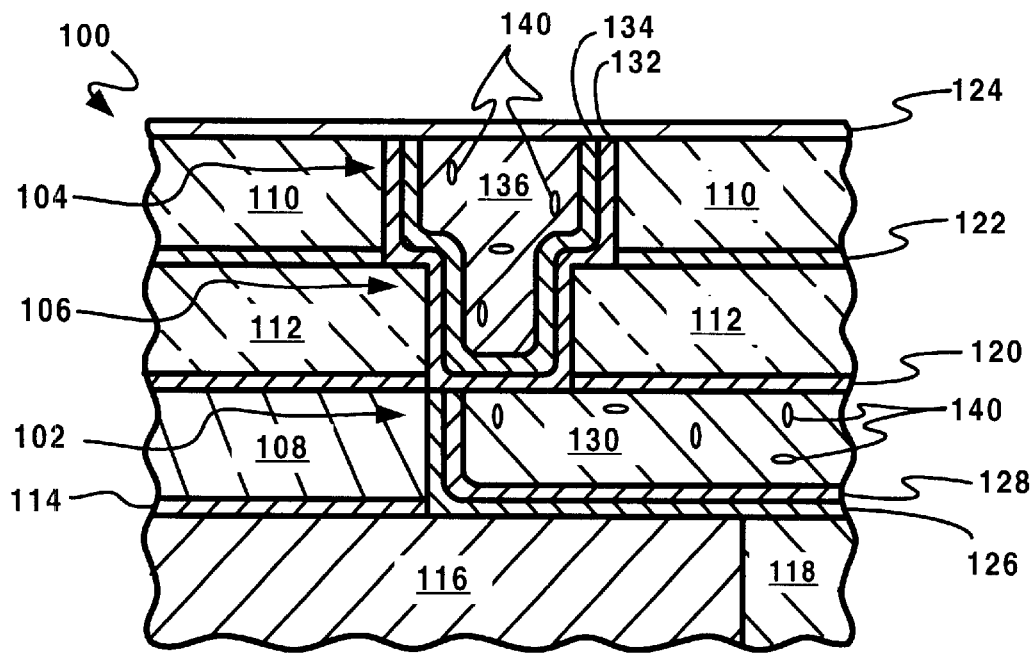
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

Generally, the semiconductor wafer 100 is subject to annealing to increase grain size of the conductor cores 130 and 136 and to relieve stress. Often, the annealing results in the coalescence of imperceptible microscopic voids into macroscopic voids 140. The macroscopic voids 140 reduce the current carrying capability of the conductor cores 130 and 136 and potentially lead to early failures of the integrated circuit.

In the past, for copper conductor material and seed layers, highly resistive diffusion barrier materials such as tantalum nitride (TaN), titanium nitride (TiN), or tungsten nitride (WN) were used as barrier materials to prevent diffusion.

Figure 3:
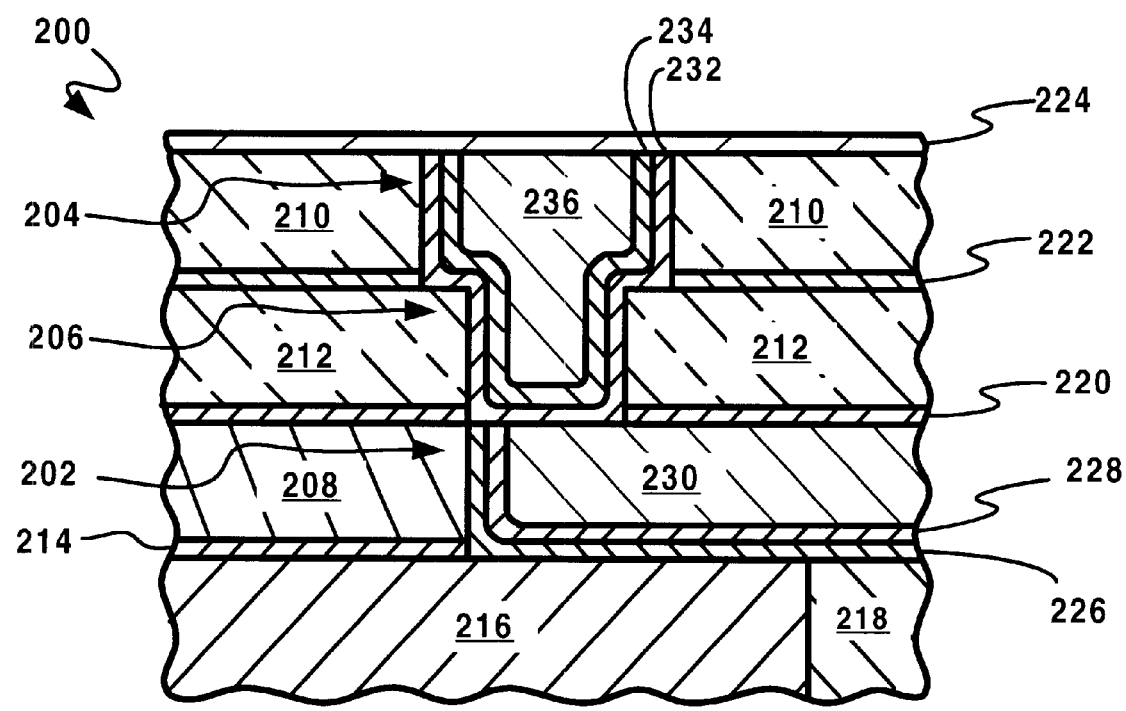
FIG. 3 is a cross-section similar to FIG. 2 (PRIOR ART) after deposition and anneal of the conductor core in accordance with the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

In manufacturing, a portion of the first channel 202 is disposed in a first channel stop layer 214 and is on a device dielectric layer 216. Generally, metal contacts are formed in the device dielectric layer 216 to connect to an operative semiconductor device (not shown). This is represented by the contact of the first channel 202 with a semiconductor contact 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a capping layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition.

To manufacture the structure of the present invention, after the device dielectric layer 216 is deposited, the first channel stop layer 214 is deposited. The first channel dielectric layer 208 is deposited, photolithographically patterned and etch processed along with the channel stop layer 222 to form an opening for the first channel 202 that also exposes the semiconductor contact 218. The barrier, seed, and conductor core materials are successively deposited.

For a single damascene structure, the semiconductor wafer 100 is heated from room temperature to anneal temperature in two steps. In a first step, the semiconductor wafer 200 is heated from room temperature to an anneal temperature from 40° C. to 90° C. and held for from 30 to 120 minutes before being heated to a second step anneal from 250° C. to 400° C. and held for up to 30 minutes. The macroscopic voids 140 (as shown in FIG. 2) are not formed and this is believed to be due to the mobility of the atoms of the conductor core 230 during the first step anneal which prevent the microscopic voids from coalescing.

For a dual damascene structure, both the via 206 and the second channel 204 are formed at the same time in a process similar to the single damascene process.

As would be evident to those skilled in the art, different combinations of the disclosed annealing steps are within the scope of the present invention.

The barrier, seed, and conductor core materials are then chemical-mechanical polished to form the barrier layer 226, seed layer 228, and the conductor core 230. Finally, the structure is capped with the capping layer 220.

In the various embodiments, the barrier layers are of materials such as tantalum (Ta), titanium (Ti), tungsten (W), nitrides thereof, and a combination thereof. The seed layers and conductor cores are of materials such as copper (Cu), copper-base alloys, aluminum (Al), aluminum-base alloys, gold (Au), gold-base alloys, silver (Ag), silver-base alloys, and a combination thereof. The dielectric layers are of silicon dioxide or a low dielectric material such as HSQ, Flare, etc. The stop layers are of materials such as silicon nitride or silicon oxynitride.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufactoring an integrated circuit comprising:

providing a semiconductor substrate having a semiconductor device provided thereon;

forming a dielectric layer over the semiconductor substrate;

forming an opening in the dielectric layer;

depositing a barrier layer to line the opening;

depositing a seed layer on the barrier layer;

depositing a conductor layer over the seed layer to fill the opening and connect to the semiconductor device;

planarizing the conductor, seed, and barrier layers to be coplanar with the dielectric layer to form a conductor channel therein;

a first annealing performed at a temperature from 40° C. to 90° C.; and a second annealing performed at a higher temperature than the first annealing.

2. The method of manufacturing an integrated circuit as claimed in claim 1 wherein the second annealing is performed at a temperature from 250° C. to 400° C.

3. The method of manufactoring an integrated circuit as claimed in claim 1 wherein the first annealing is performed from 30 minutes to 120 minutes.

4. The method of manufacturing an integrated circuit as claimed in claim 1 wherein the second annealing is performed for from 1 minute to 30 minutes.

5. The method of manufacturing an integrated circuit as claimed in claim 1 wherein depositing the conductor layer deposits a metal selected from a group consisting of copper, copper-base alloys, aluminum, gold, gold-base alloys, silver, silver-base alloys, and a combination thereof.

6. The method of manufacturing an integrated circuit as claimed in claim 1 wherein forming the dielectric layer uses a material selected from a group of materials having dielectric constants from 4.2 to 3.9.

7. The method of manufacturing an integrated circuit as claimed in claim 1 wherein forming the dielectric layer uses a material selected from a group of materials having dielectric constants below 3.9.

8. The method of manufacturing an integrated circuit as claimed in claim 1 wherein the first annealing includes heating from room temperature to the first annealing temperature and holding the first annealing temperature for a first period of time.

9. The method of manufacturing an integrated circuit as claimed in claim 1 wherein second annealing includes heating from the first annealing temperature to a second annealing temperature and holding the second annealing temperature for a second period of time.

\* \* \* \* \*

UNITED STATES PATENT AND TRADEMARK OFFICE
CERTIFICATE OF CORRECTION

PATENT NO.    : 6,403,474 B1
DATED         : June 11, 2002
INVENTOR(S)   : Avanzino et al.

It is certified that error appears in the above-identified patent and that said Letters Patent is hereby corrected as shown below:

Column 6,
Line 6, delete "manufactoring" and insert therefor -- manufacturing --
Line 28, delete "manufactoring" and insert therefor -- manufacturing --

Signed and Sealed this

Twenty-third Day of July, 2002

Attest:

Attesting Officer

JAMES E. ROGAN
Director of the United States Patent and Trademark Office